(12) United States Patent
Chow et al.

(10) Patent No.: US 6,897,535 B2
(45) Date of Patent: May 24, 2005

(54) INTEGRATED CIRCUIT WITH REVERSE ENGINEERING PROTECTION

(75) Inventors: Lap-Wai Chow, South Pasadena, CA (US); William M. Clark, Jr., Camarillo, CA (US); James P. Baukus, Westlake Village, CA (US)

(73) Assignee: HRL Laboratories, LLC, Malibu, CA (US)

(*) Notice: Subject to any disclaimer, the term of this patent is extended or adjusted under 35 U.S.C. 154(b) by 0 days.

(21) Appl. No.: 10/438,689

(22) Filed: May 14, 2003

(65) Prior Publication Data

US 2003/0214002 A1 Nov. 20, 2003

Related U.S. Application Data

(60) Provisional application No. 60/378,155, filed on May 14, 2002.

(51) Int. Cl.[7] .................. H01L 29/76; H01L 29/94; H01L 31/062; H01L 31/113; H01L 31/119
(52) U.S. Cl. .................. 257/401; 257/382; 257/384; 257/385
(58) Field of Search .................. 257/368, 382, 257/384, 385, 401, 383

(56) References Cited

U.S. PATENT DOCUMENTS

| 3,673,471 A | 6/1972 | Klein et al. ............. 257/407 |
| 3,946,426 A | 3/1976 | Sanders ............. 357/71 |
| 4,017,888 A | 4/1977 | Christie et al. ............. 357/54 |

(Continued)

FOREIGN PATENT DOCUMENTS

| EP | 0 186 855 A2 | 7/1986 |
| EP | 0 364 769 A2 | 4/1990 |
| EP | 0 364 769 | 4/1990 |
| EP | 0 463 373 A2 | 1/1992 |
| EP | 0 463 373 | 1/1992 |
| EP | 0 528 302 A1 | 2/1993 |
| EP | 0 585 601 A1 | 3/1994 |
| EP | 0 764 985 A2 | 3/1997 |
| EP | 0 883 184 A2 | 12/1998 |
| EP | 0 920 057 A2 | 6/1999 |
| EP | 1 193 758 A1 | 4/2002 |
| EP | 1 202 353 A1 | 5/2002 |
| FR | 2486717 | 1/1982 |
| FR | 2 486 717 | 1/1982 |
| JP | 58-190064 | 11/1983 |
| JP | 61-147551 | 7/1986 |
| JP | 63-129647 | 6/1988 |
| JP | 63-129647 A | 6/1988 |
| JP | 02-046762 | 2/1990 |
| JP | 02-237038 | 9/1990 |
| JP | 04-028092 | 1/1992 |
| JP | 10-256398 | 9/1998 |
| WO | 98/21734 | 5/1998 |
| WO | 98/57373 | 12/1998 |
| WO | 00/44012 | 7/2000 |

OTHER PUBLICATIONS

Blythe, et al., "Layout Reconstruction of Complex Silicon Chips," *IEEE Journal of Solid–State Circuits*, pp. 138–145 (Feb. 1993).

Frederiksen, Thomas M., "Standard Circuits in the New CMOS Era," *Intuitive CMOS Electronics, Revised Edition*, pp. 134–146 (1989).

(Continued)

*Primary Examiner*—Ngân V. Ngô
(74) *Attorney, Agent, or Firm*—Ladas & Parry

(57) ABSTRACT

Technique and structures for camouflaging an integrated circuit structure. The integrated circuit structure is formed by a plurality of layers of material having controlled outlines and controlled thicknesses. A layer of dielectric material of a controlled thickness is disposed among said plurality of layers to thereby render the integrated circuit structure intentionally inoperable.

22 Claims, 5 Drawing Sheets

U.S. PATENT DOCUMENTS

| | | | |
|---|---|---|---|
| 4,101,344 A | 7/1978 | Kooi et al. | 148/1.5 |
| 4,139,864 A | 2/1979 | Schulman | 358/188 |
| 4,164,461 A | 8/1979 | Schilling | 204/192 EC |
| 4,196,443 A | 4/1980 | Dingwall | 257/774 |
| 4,267,578 A | 5/1981 | Vetter | 364/709 |
| 4,291,391 A | 9/1981 | Chatterjee et al. | 365/184 |
| 4,295,897 A | 10/1981 | Tubbs et al. | 148/1.5 |
| 4,314,268 A | 2/1982 | Yoshioka et al. | 357/48 |
| 4,317,273 A | 3/1982 | Guterman et al. | 29/571 |
| 4,322,736 A | 3/1982 | Sasaki et al. | 257/369 |
| 4,374,454 A | 2/1983 | Jochems | 29/571 |
| 4,409,434 A | 10/1983 | Basset et al. | 380/265 |
| 4,435,895 A | 3/1984 | Parrillo | 29/571 |
| 4,471,376 A | 9/1984 | Morcom et al. | 357/71 |
| 4,581,628 A | 4/1986 | Miyauchi et al. | 357/71 |
| 4,583,011 A | 4/1986 | Pechar | 307/440 |
| 4,603,381 A | 7/1986 | Guttag et al. | 364/200 |
| 4,623,255 A | 11/1986 | Suszko | 356/389 |
| 4,727,493 A | 2/1988 | Taylor, Sr. | 364/490 |
| 4,766,516 A | 8/1988 | Ozdemir et al. | 361/380 |
| 4,799,096 A | 1/1989 | Koeppe | 357/42 |
| 4,821,085 A | 4/1989 | Haken et al. | 357/67 |
| 4,830,974 A | 5/1989 | Chang et al. | 437/34 |
| 4,939,567 A | 7/1990 | Kenney | 257/383 |
| 4,962,484 A | 10/1990 | Takeshima et al. | 365/226 |
| 4,975,756 A | 12/1990 | Haken et al. | 357/4.1 |
| 4,998,151 A | 3/1991 | Korman et al. | 257/328 |
| 5,030,796 A | 7/1991 | Swanson et al. | 174/52.2 |
| 5,050,123 A | 9/1991 | Castro | 365/53 |
| 5,061,978 A | 10/1991 | Mizutani et al. | 357/30 |
| 5,065,208 A | 11/1991 | Shah et al. | 357/34 |
| 5,068,697 A | 11/1991 | Noda et al. | 357/23.5 |
| 5,070,378 A | 12/1991 | Yamagata | 357/23.5 |
| 5,101,121 A | 3/1992 | Sourgen | 307/465 |
| 5,117,276 A | 5/1992 | Thomas et al. | 357/71 |
| 5,121,089 A | 6/1992 | Larson | 333/107 |
| 5,121,186 A | 6/1992 | Wong et al. | 257/384 |
| 5,132,571 A | 7/1992 | McCollum et al. | 307/465.1 |
| 5,138,197 A | 8/1992 | Kuwana | 307/449 |
| 5,146,117 A | 9/1992 | Larson | 307/465 |
| 5,168,340 A | 12/1992 | Nishimura | 357/376 |
| 5,177,589 A | 1/1993 | Kobayashi et al. | 257/773 |
| 5,202,591 A | 4/1993 | Walden | 307/450 |
| 5,225,699 A | 7/1993 | Nakamura | 257/306 |
| 5,227,649 A | 7/1993 | Chapman | 257/204 |
| 5,231,299 A | 7/1993 | Ning et al. | 257/316 |
| 5,302,539 A | 4/1994 | Haken et al. | 437/41 |
| 5,308,682 A | 5/1994 | Morikawa | 428/195 |
| 5,309,015 A | 5/1994 | Kuwata et al. | 257/659 |
| 5,317,197 A | 5/1994 | Roberts | 257/401 |
| 5,336,624 A | 8/1994 | Walden | 437/34 |
| 5,341,013 A | 8/1994 | Koyanagi et al. | 257/368 |
| 5,345,105 A | 9/1994 | Sun et al. | 257/659 |
| 5,354,704 A | 10/1994 | Yang et al. | 437/52 |
| 5,369,299 A | 11/1994 | Byrne | 257/638 |
| 5,371,390 A | 12/1994 | Mohsen | 257/209 |
| 5,376,577 A | 12/1994 | Roberts et al. | 437/52 |
| 5,384,472 A | 1/1995 | Yin | 257/207 |
| 5,384,475 A | 1/1995 | Yahata | 257/314 |
| 5,399,441 A | 3/1995 | Bearinger et al. | 428/689 |
| 5,404,040 A | 4/1995 | Hshieh et al. | 257/341 |
| 5,412,237 A | 5/1995 | Komori et al. | 257/306 |
| 5,441,902 A | 8/1995 | Hsieh et al. | 437/34 |
| 5,468,990 A | 11/1995 | Daum | 257/632 |
| 5,475,251 A | 12/1995 | Kuo et al. | 257/316 |
| 5,506,806 A | 4/1996 | Fukushima | 365/195 |
| 5,531,018 A | 7/1996 | Saia et al. | 29/622 |
| 5,539,224 A | 7/1996 | Ema | 257/211 |
| 5,541,614 A | 7/1996 | Lam et al. | 343/792.5 |
| 5,571,735 A | 11/1996 | Mogami et al. | 437/41 |
| 5,576,988 A | 11/1996 | Kuo et al. | 365/185.04 |
| 5,611,940 A | 3/1997 | Zettler | 73/514.16 |
| 5,638,946 A | 6/1997 | Zavracky | 200/181 |
| 5,656,836 A | 8/1997 | Ikeda et al. | 257/305 |
| 5,677,557 A | 10/1997 | Wuu et al. | 257/382 |
| 5,679,595 A | 10/1997 | Chen et al. | 437/52 |
| 5,700,704 A | 12/1997 | Ikeda et al. | 437/52 |
| 5,719,422 A | 2/1998 | Burr et al. | 257/336 |
| 5,719,430 A | 2/1998 | Goto | 257/403 |
| 5,721,150 A | 2/1998 | Pasch | 437/46 |
| 5,783,846 A | 7/1998 | Baukus et al. | 257/204 |
| 5,821,590 A | 10/1998 | Lee et al. | 257/377 |
| 5,834,851 A | 11/1998 | Ikeda et al. | 257/903 |
| 5,838,047 A | 11/1998 | Yamauchi et al. | 257/372 |
| 5,854,510 A | 12/1998 | Sur, Jr. et al. | 257/529 |
| 5,866,933 A | 2/1999 | Baukus et al. | 257/368 |
| 5,880,503 A | 3/1999 | Matsumoto et al. | 257/372 |
| 5,888,887 A | 3/1999 | Li et al. | 438/525 |
| 5,895,241 A | 4/1999 | Lu et al. | 438/275 |
| 5,920,097 A | 7/1999 | Horne | 257/368 |
| 5,930,663 A | 7/1999 | Baukus et al. | 438/598 |
| 5,930,667 A | 7/1999 | Oda | 438/622 |
| 5,973,375 A | 10/1999 | Baukus et al. | 257/399 |
| 5,977,593 A | 11/1999 | Hara | 257/356 |
| 5,998,257 A | 12/1999 | Lane et al. | 438/253 |
| 6,037,627 A | 3/2000 | Kitamura et al. | 257/324 |
| 6,046,659 A | 4/2000 | Loo et al. | 333/262 |
| 6,054,659 A | 4/2000 | Lee et al. | 200/181 |
| 6,057,520 A | 5/2000 | Goodwin-Johansson | 200/181 |
| 6,066,894 A * | 5/2000 | Yokozeki | 257/754 |
| 6,080,614 A | 6/2000 | Neilson et al. | 438/238 |
| 6,093,609 A | 7/2000 | Chuang | 438/286 |
| 6,117,762 A | 9/2000 | Baukus et al. | 438/618 |
| 6,118,152 A | 9/2000 | Yamaguchi et al. | 257/347 |
| 6,137,318 A | 10/2000 | Takaaki | 326/112 |
| 6,154,388 A | 11/2000 | Oh | 365/185.04 |
| 6,166,419 A | 12/2000 | Araki | 257/500 |
| 6,215,158 B1 | 4/2001 | Choi | 257/368 |
| 6,255,155 B1 | 7/2001 | Lee et al. | 438/222 |
| 6,294,816 B1 | 9/2001 | Baukus et al. | 257/368 |
| 6,326,675 B1 | 12/2001 | Scott et al. | 257/608 |
| 6,365,453 B1 | 4/2002 | Deboer et al. | 438/253 |
| 6,503,787 B1 | 1/2003 | Choi | 438/214 |
| 6,570,222 B2 | 5/2003 | Nozaki et al. | 257/347 |
| 6,614,080 B2 * | 9/2003 | Vajana et al. | 257/390 |
| 6,740,942 B2 | 5/2004 | Baukus et al. | 257/406 |
| 2002/0096776 A1 * | 7/2002 | Chow et al. | 257/774 |
| 2002/0190355 A1 * | 12/2002 | Baukus et al. | 257/668 |

OTHER PUBLICATIONS

Hodges and Jackson, *Analysis and Design of Digital Integrated Circuits*, 2nd edition, McGraw–Hill, p. 353 (1988).

IBM_TDB, "Double Polysilicon Dynamic Memory Cell with Polysilicon Bit line," pp. 3828–3831 (Feb. 1979).

IBM_TDB, "Static Ram Double Polysilicon Process," pp. 3683–3686 (Jan. 1981).

Larson, L.E., et al., "Microactuators for GaAs–based Microwave Integrated Circuits," *IEEE*, pp. 743–746 (1991).

Lee, "Engineering a Device for Electron–beam Probing," *IEEE Design and Test of Computers*, pp. 36–49 (1989).

Ng, K.K., *Complete Guide to Semiconductor Devices*, McGraw–Hill, Inc., pp 164–165 (1995).

Sze, S.M., *VLSI Technology*, McGraw–Hill, pp. 99, 447, 461–465 (1983).

Sze, S.M., ed., "Silicides for Gates and Interconnections," *VLSI Technology*, McGraw–Hill, pp. 372–380 (1983).

Blythe, S., et al., "Layout Reconstruction of Complex Silicon Chips," *IEEE Journal of Solid–State Circuits*, vol. 28, Issue 2, pp. 138–145 (Feb. 1993).

Frederiksen, Thomas M., "Standard Circuits in the New CMOS Era," *Intuitive CMOS Electronics, Revised Edition*, pp. 134–145 (1989).

Hodges and Jackson, *Analysis and Design of Digital Integrated Circuits*, 2nd edition, McGraw–Hill, p. 353 (1988).

IBM_TDB, "Double Polysilicon Dynamic Memory Cell with Polysilicon Bit line," pp. 3828–3831 (Feb. 1979).

IBM_TDB, "Static Ram Double Polysilicon Process," pp. 3683–3686 (Jan. 1981).

Larson, L.E., et al., "Microactuators for GaAs–based Microwave Integrated Circuits," *IEEE*, pp. 743–746 (1991).

Lee, W.T., "Engineering a Device for Electron–Beam Probing," *IEEE Design and Test of Computers*, pp. 36–49 (1989).

Ng, K.K., *Complete Guide to Semiconductor Devices*, McGraw–Hill, Inc., pp 164–165 (1995).

Sze, S.M., *VLSI Technology*, McGraw–Hill, pp. 99, 447, 461–465 (1983).

Sze, S.M., ed., "Silicides for Gates and Interconnections," *VLSI Technology*, McGraw– Hill, pp. 372–380 (1983).

* cited by examiner

INTEGRATED CIRCUIT WITH REVERSE ENGINEERING PROTECTION

CROSS REFERENCE TO RELATED APPLICATIONS

This application claims the benefit of U.S. Provisional Patent Application 60/378,155 filed May 14, 2002, which application is incorporated herein by reference.

TECHNICAL FIELD

The present invention relates to integrated circuits and semiconductor devices (ICs) in general and their methods of manufacture wherein the integrated circuits and semiconductor devices employ camouflaging techniques which make it difficult for a reverse engineer to discern how the semiconductor device is manufactured.

RELATED ART

The present invention is related to the following U.S. Patents, all of which were filed by the same inventors:

(1) U.S. Pat. Nos. 5,866,933; 5,973,375 and 6,294,816 teach how transistors in a CMOS circuit are connected by implanted (and therefore hidden and buried) lines between the transistors by modifying the p+ and n+ source/drain masks. These implanted interconnections are used to make 3-input AND and 3-input OR circuits look substantially identical to the reverse engineer. Also, buried interconnects force the reverse engineer to examine the IC in greater depth to try to figure out the connectivity between transistors and hence their function.

(2) U.S. Pat. Nos. 5,783,846; 5,930,663 and 6,064,110 teach a further modification in the source/drain implant masks so that the implanted connecting lines between transistors have a gap therein, the gap having a length approximating the minimum feature size of the CMOS technology being used. If this gap is "filled" with one kind of implant, the line conducts; but if it is "filled" with another kind of implant, the line does not conduct. The intentional gaps are called "channel blocks." The reverse engineer is forced to determine connectivity on the basis of resolving the implant type at the minimum feature size of the CMOS process being used.

(3) U.S. Pat. No. 6,117,762 teaches a method and an apparatus for protecting semiconductor integrated circuits from reverse engineering. Semiconductor active areas are formed on a substrate, and a silicide layer is formed over at least one active area of the semiconductor active areas and over a selected substrate area for interconnecting at least one active area with another area through the silicide area formed on the selected substrate area.

BACKGROUND OF THE INVENTION

The creation of complex integrated circuits and semiconductor devices can be a very expensive undertaking given the large number of hours of sophisticated engineering talent involved in designing such devices. Additionally, integrated circuits can include read only memories and/or EEPROMs into which software, in the form of firmware, is encoded. Additionally, integrated circuits are often used in applications involving the encryption of information, and therefore in order to keep such information confidential, it can be desirable to keep such devices from being reverse engineered. Thus, there can be a variety of reasons for protecting integrated circuits and other semiconductor devices from being reverse engineered.

In order to keep the reverse engineer at bay, different techniques are known in the art to make integrated circuits more difficult to reverse engineer. One technique is to make the connections between transistors difficult to determine forcing the reverse engineer to carefully analyze each transistor (in particular each CMOS transistor pair for CMOS devices). Bit camouflaging the connections between transistors, the reverse engineer is unable to use automatic circuit and pattern recognition techniques in order to reverse engineer an integrated circuit. Since integrated circuits can have hundreds of thousands or even millions of transistors, forcing the reverse engineer to carefully analyze each transistor in a device can effectively frustrate the reverse engineer's ability to reverse engineer the device successfully.

The prior art techniques mentioned above, if successful, will force the reverse engineer to study the metal connections in an attempt to figure out the boundaries of standard circuits and their function. For example, gate connections may utilize the polysilicon layer (typically the first polysilicon layer in a process having two or more polysilicon layers) and the reverse engineer, knowing that such gate contacts are typically the input to transistors and hence to a standard circuit, would look for these contacts. Also, the source and drain contacts are made to the substrate via metal interconnect. One way in which the reverse engineer might work would be to look for cell boundaries by means of looking for silicon-to-gate poly metal lines as these suggest the possibilities for contacts between the output (the drain contact) from one transistor cell into the input (the gate contact) of a next transistor cell. If this can be done, the reverse engineer can define cell boundaries by these silicon-gate poly lines. Then by noting the cell boundaries, the reverse engineer can find the cell characteristics (for example, size and number of transistors) and from this make reasonable assumptions as to the cell's function. This information can then be stored in a database for automatic classification of other similar cells.

It is an object of this invention to make reverse engineering even more difficult and, in particular, to force the reverse engineer to study the possible silicon-to-gate poly lines very carefully, to see if they are in fact real. It is believed that this will make the reverse engineer's efforts all the more difficult by making it very time consuming in order to reverse engineer a chip employing the present invention and perhaps making it exceedingly impractical, if not impossible, to reverse engineer a chip employing the present invention.

The Inventors named herein have previously filed Patent Applications and have received Patents relating to the camouflage of integrated circuit devices in order to make it more difficult to reverse engineer them as discussed above. The present invention can often be used harmoniously with the techniques disclosed in these prior United States Patents to further confuse the reverse engineer.

In modern semiconductor manufacturing processes, particularly where the feature size is less than 0.5 micrometers, a silicide layer is typically used to improve conductivity. FIG. 1 is a plan view of a semiconductor device. FIGS. 1A, 1B and 1C are cross-sectional views of the semiconductor device shown in plan view in FIG. 1. A typical drain or source contact is shown in FIG. 1A, while a typical gate contact is shown in FIG. 1B. The drain, source and gate regions are formed on a semiconductor substrate, such as silicon substrate 10, and have active regions 12, 16, 18, as shown in FIG. 1C, formed therein, typically by implantation of a suitable dopant. Field oxide (FOX) 20 is used to help isolate one semiconductor device from another, in the usual fashion. The drain contact structure, as shown in FIG. 1A, has a conventional silicide layer 26-1 formed over its active region 18. A refractive metal contact 30 and plug 31 combination is formed on the silicide layer 26-1. Silicide layer 26-1 provides a surface for a refractive metal gate contact 30 and plug 31 combination, the metal contact frequently including a plug of refractive metal 31 which extends through an opening in a dielectric layer 29, which may be deposited $SiO_2$. The refractive metal gate contact 30 and metal plug 31 combination makes contact with the silicide layer 26-1. The source structure is similar to the drain structure depicted in FIG. 1A, where the active region 18 is replaced by active region 16.

The gate structure, as shown in FIG. 1B, has a relatively thin gate oxide layer 22 which is covered by a layer of polysilicon 24-1, which in turn is covered by a silicide layer 26-1 (suicide layer 26-1 is traditionally referred to as a "salicide" layer when used with a polysilicon layer 24-1 as is the case here) Silicide layer 26-1 provides a surface for a refractive metail gale contact 30 the metal contact frequently including a plug of refractive metal 31 which extends through an opening in a dielectric layer 29, which may be deposited $SiO_2$. The metal plug 31 makes contact with the silicide layer 26-1.

FIG. 1C is a cross-sectional view through the active areas 16, 18 and gate area 12 of a semiconductor device. The sidewall spacers 21 provide for the separation of the gate area 12 and active regions 16, 18 during processing. The remaining details of FIG. 1C are the same as those found in FIGS. 1A and 1B. Those skilled in the art will appreciate other fabrication details are omitted from the drawings since their use is well known in the art.

It is also common in the prior art to use a double-polysilicon CMOS fabrication process. Such a process is currently used by many commercial IC chip manufacturers, especially smart card chip manufacturers. The double-polysilicon (or simply double poly) process can be used to make a variety of devices, including CMOS transistor pairs, floating gate structures and even bipolar transistors. See, for example, U.S. Pat. No. 4,784,966 to Chen. A double-polysilicon CMOS process also supports the manufacture of EEPROMs, which are commonly used in applications such as smart card chips and the like.

SUMMARY OF THE INVENTION

In one aspect, the present invention provides a camouflaged circuit structure, comprising: a semiconductor substrate; an implanted region in said substrate; a metal layer which is associated with said implanted region and which appears, in plan view, to be electrically coupled to said implanted region; and a dielectric layer disposed between said implanted region and said metal layer to thereby insulate said metal layer from said implanted region, the dielectric layer having dimensions such that when viewed in said plan view, said dielectric layer is at least partially hidden by a feature of the circuit structure.

Another aspect of the present invention provides a camouflaged circuit structure, comprising: a semiconductor substrate; an active region in said substrate; a conductive layer which is associated with said active region and which appears, in plan view, to be arranged to influence conduction through said active region by an application of control voltages thereto; a control electrode which is associated with said conductive layer and which appears, in plan view, to be electrically connected to said conductive layer; and at least one dielectric layer disposed between said conductive layer and said control electrode for intentionally keeping said conductive layer from influencing conduction through said active region in response to an application of control voltages to said control electrode.

Another aspect of the present invention provides a method of deterring a reverse engineer comprising the steps of: associating at least one conductive contact with an active area; and preventing electrical conduction between said at least one conductive contact and said active area by inserting an intervening insulating layer.

Another aspect of the present invention provides a pseudo-transistor comprising: an active region disposed in a substrate; an insulating, non-electrically conductive layer disposed over at least a portion of said active region; a polysilicon layer disposed over at least a portion of said insulating, non-electrically conductive layer disposed over at least a portion of said active region, the insulating, non-electrically conductive layer electrically isolating the polysilicon layer from the active region; and a metal layer in electrical communication with said polysilicon layer and electrically isolated from the active region, the insulating, non-electrically conductive layer, the polysilicon layer and the the metal layer each having dimensions such that when viewed in a plan view, the metal layer appears to be in electrical communication with the active region.

Another aspect of the present invention provides a non-operational semiconductor gate contact comprising: a metal layer; a first polysilicon layer; a second polysilicon layer disposed at least between said metal layer and said first polysilicon layer; and an insulating, non-conductive layer disposed at least between said first polysilicon layer and said second polysilicon layer.

Another aspect of the present invention provides a method for manufacturing a pseudo-transistor comprising the steps of: implanting an active region in a substrate; placing a dielectric layer over at least a portion of said active region; and disposing a metal layer over said dielectric layer, wherein said dielectric layer prevents an electrical connection between said active region and said metal layer.

Another aspect of the present invention provides a method for confusing a reverse engineer comprising the steps of: implanting an active region in a substrate; associating a conductive layer with said active region; disposing at a dielectric layer over said conductive layer; and providing a control electrode, wherein said dielectric layer prevents said conductive layer from influencing conduction through said active region in response to an application of control voltages to said control electrode.

The present invention is compatible with the standard double-polysilicon CMOS process in which at least one of the polysilicon layers (typically the second or upper polysilicon layer) is deposited after active area implants, i.e., after the source and drain implants. The prior art process is modified by placing a dielectric layer over an apparent contact area so as to defeat what would otherwise appear as a standard metal contact. This can be done in at least the following two contexts:

(1) The second polysilicon area and oxide combination are deposited over a source or drain contact region to which a metal contact will be subsequently applied. In this way, the metal contact is not electrically connected to the underlying source or drain region, and therefore that which appears to be a contact does not function as one. However, to the reverse engineer, the metal contact appears to be a normal metal contact and therefore the reverse engineer will assume that the transistor associated therewith is operable.

(2) The second polysilicon area and oxide combination are deposited over a self aligned polysilicon gate layer rendering the subsequently deposited metal gate non-functional.

Thus, a structure that appears to the reverse engineer to be a transistor (herein referred to as a pseudo-transistor) can be made to have a different function within a circuit than it appears to have by (i) rendering its gate non-functional, or (ii) rendering its drain contact non-functional or (iii) rendering its source contact non-functional or (iv) any combination of the foregoing. Due to the presence of the pseudo-transistors, the reverse engineer is apt to assume that each pseudo-transistor is a proper transistor when trying to copy the original integrated circuit, causing their copied circuit to function incorrectly. The true functionality of the circuit is hidden in the circuits in which the pseudo-transistors are used. Of course, if hundreds or thousands of pseudo-transistors are used in a complex integrated circuit having perhaps millions of transistors, and the reverse engineer interprets the pseudo-transistor to be a functional transistor, the reverse engineer ends up not only with a device that does not work, but the daunting task of trying to figure out what went wrong in the assumptions that he or she made in analyzing the chip to be reverse engineered and figuring out where he or she was mislead. This additional effort, if undertaken, forces the reverse engineer to spend additional time trying to determine how the chip in question is really configured.

By careful study, the reverse engineer may detect the techniques disclosed herein which render the pseudo-transistors inoperable. However, it is believed that the techniques which will be needed to detect the use of the present invention will be sufficiently time consuming to deter the reverse engineer. A complex integrated circuit may comprise millions of CMOS transistors and if the reverse engineer must carefully analyze each CMOS transistor pair in order to determine whether or not the present invention has been used to disguise each CMOS transistor, the effort involved in reverse engineering such an integrated circuit will be tremendous.

The disclosed techniques can be utilized to render a circuit non-functional. However, it is believed that the disclosed techniques are better used in applications where, instead of rendering a circuit non-functional, the circuit still functions, but functions in an unintended way. The reverse engineer ends up with a copy which "seems" to work, but does not really work to produce a useful or desired result.

Note that the present invention involving pseudo-transistors might only be used on one in a thousand instances on the chip in question, but the reverse engineer will have to look very carefully at each transistor fully knowing that for each transistor he or she sees, there is a very low likelihood that it has been modified by the present invention. The reverse engineer will be faced with having to find the proverbial needle in a haystack.

DETAILED DESCRIPTION

Figure 1:
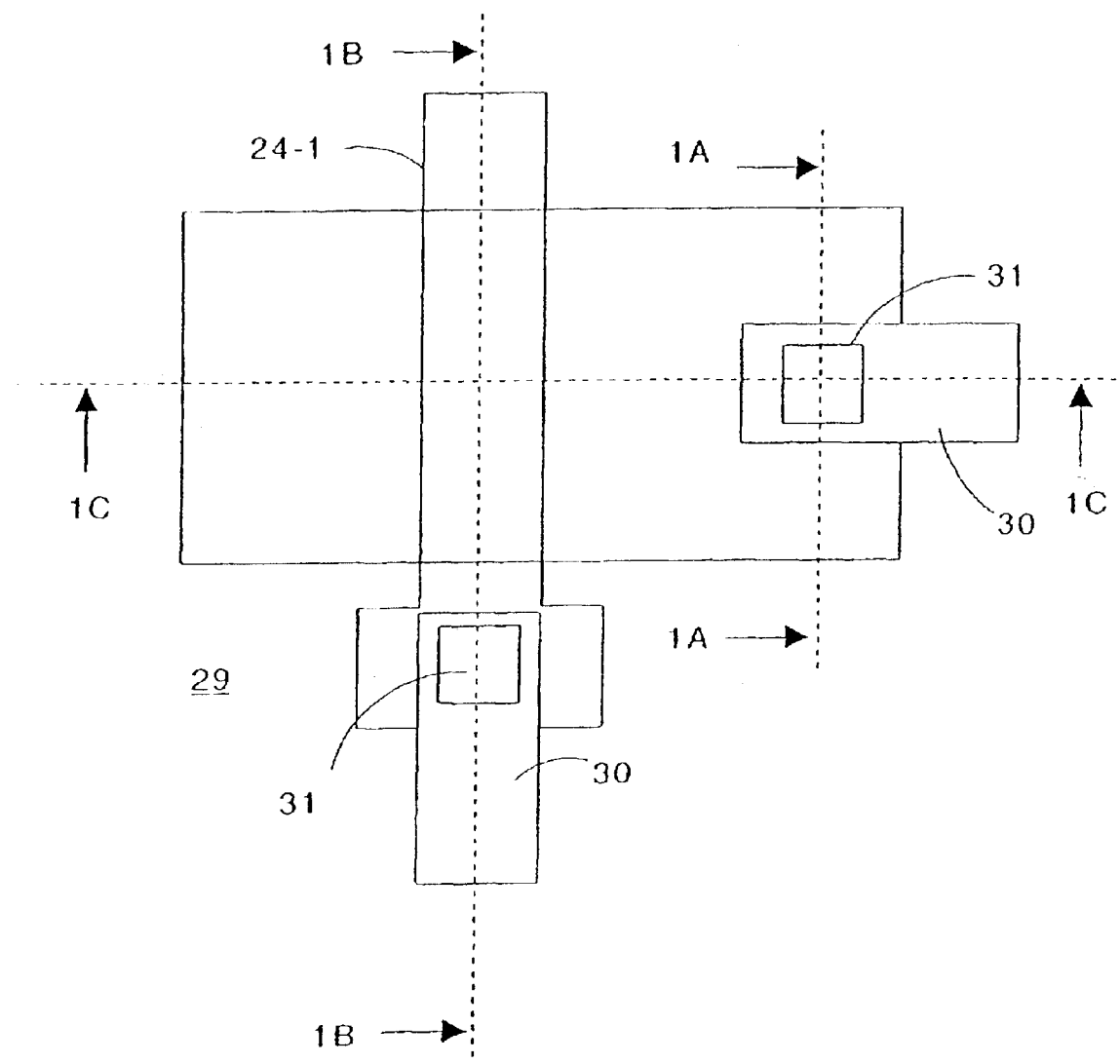
FIG. 1 is a plan view of a semiconductor device found in FIGS. 1A, 1B and 1C.
Figure 1A:
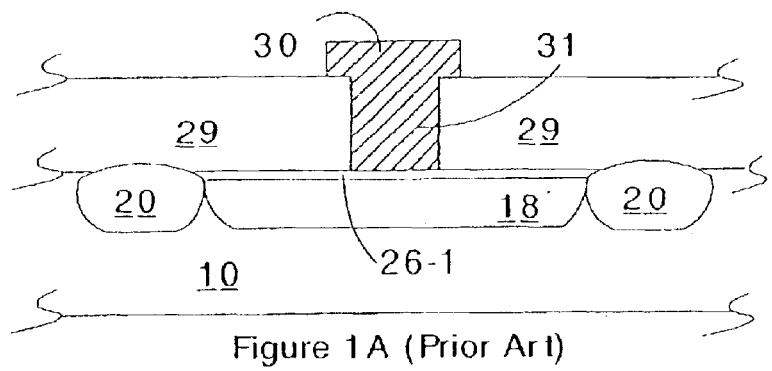
FIGS. 1A, 1B and 1C are side elevational views of a metal contact for an active area (see FIG. 1A) and a metal contact for a gate region (see FIG. 1B) and cross section through the active areas and gate area (see FIG. 1C)
Figure 1B:
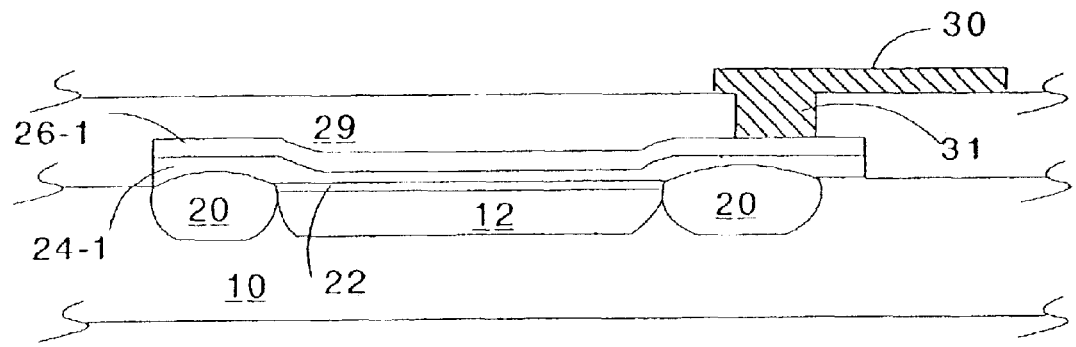
Figure 1C:
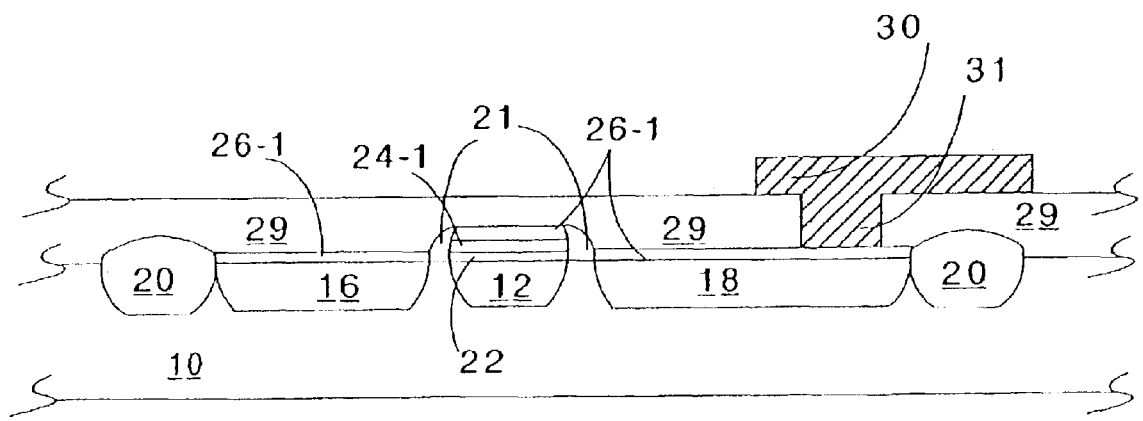
Figure 3:
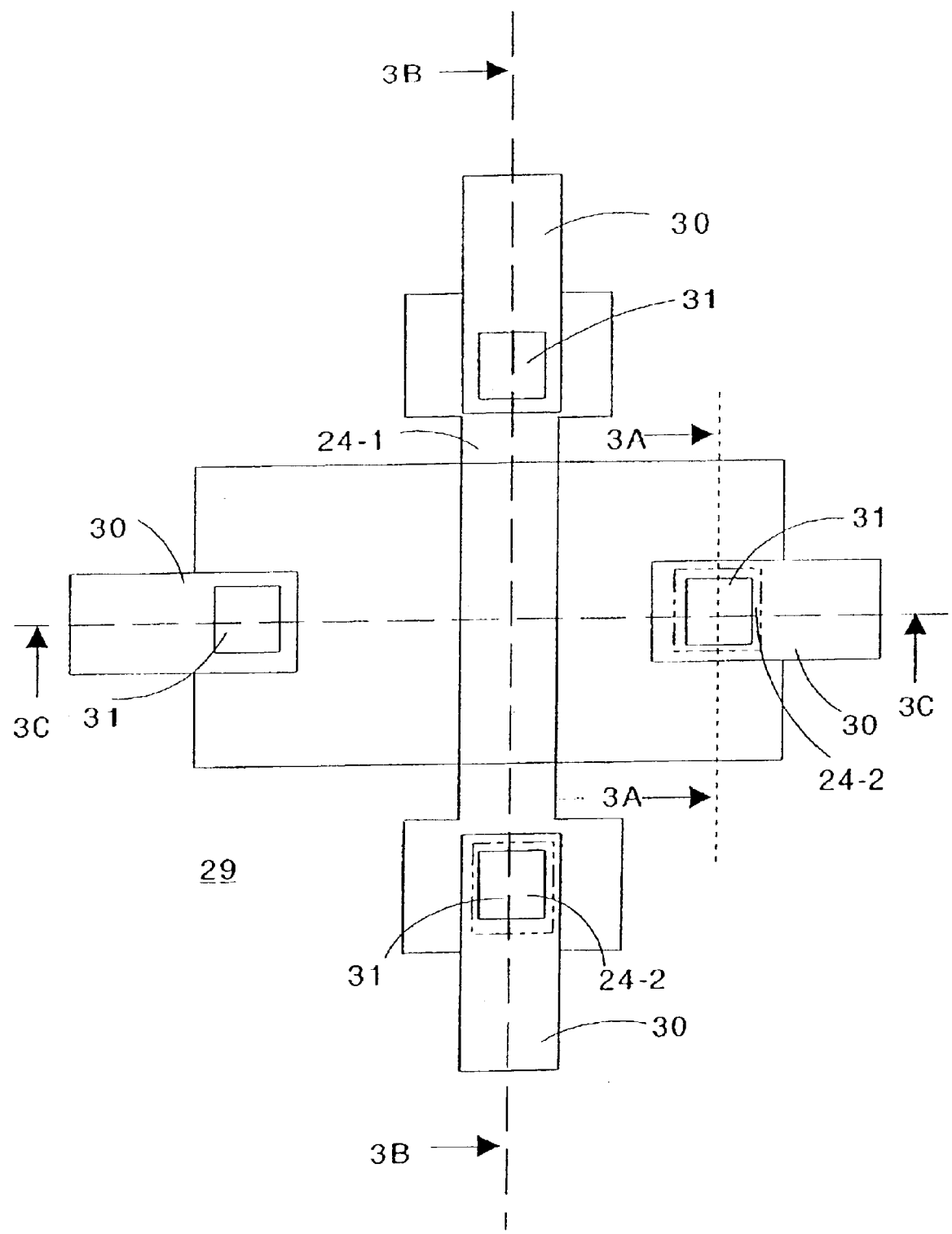
FIG. 3 is a plan view of a semiconductor device which is also depicted in FIGS. 3A, 3B and 3C.
Figure 3A:
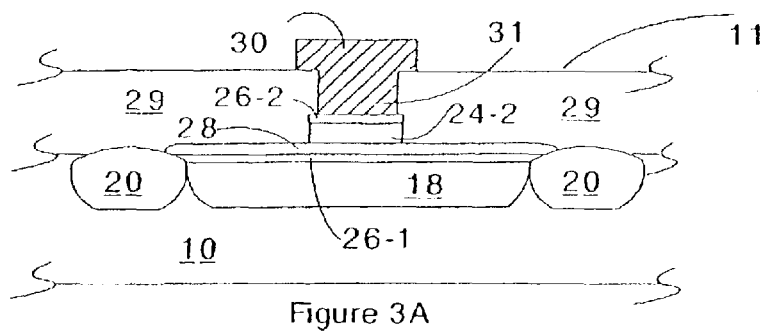
FIG. 3A is a side-sectional view along line 3A—3A depicted in FIG. 3 through a drain or source contact of a CMOS transistor employing a silicide/salicide layer, wherein a layer of oxide is utilized to render the associated contact inoperable.
Figure 3B:
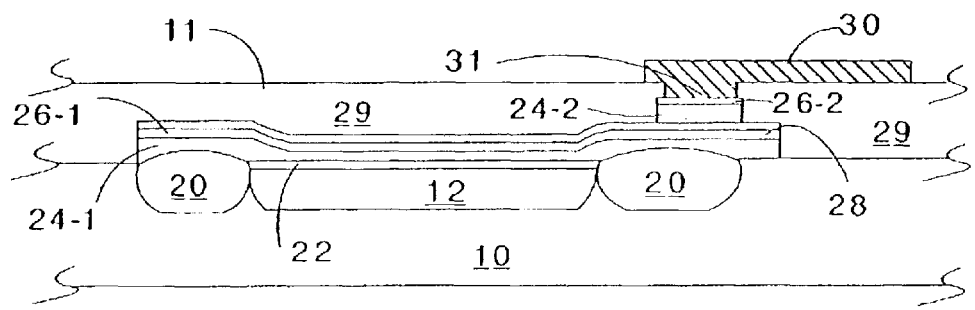
FIG. 3B is a side-sectional view along line 3B—3B depicted in FIG. 3 which is adjacent the gate region and shows how the silicide/salicide layer and the layer of oxide adjacent the gate region render the gate contact inoperable.
Figure 3C:
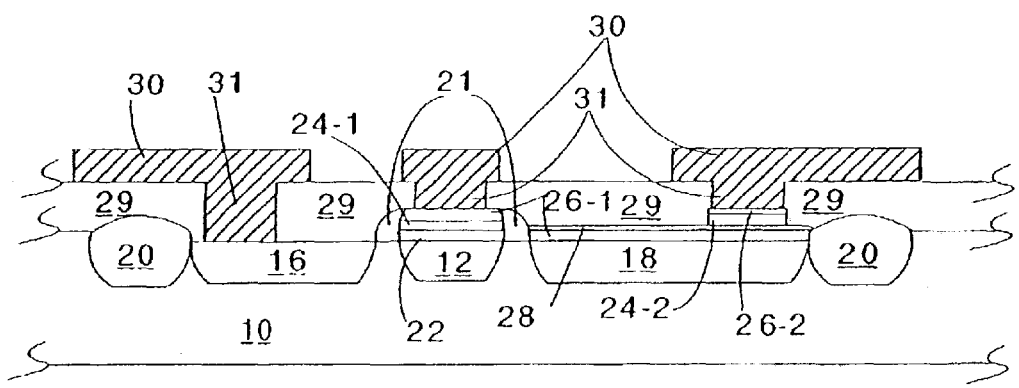
FIG. 3C is a cross-sectional view along line 3C—3C depicted in FIG. 3 depicting the layers through the source, gate and drain regions.

FIG. 3 is a plan view of the semiconductor device which appears to be a field effect transistor (FET). However, as can be seen from the cross-sectional views depicted in FIGS. 3A, 3B, and 3C the semiconductor device is a pseudo-transistor. FIG. 3A depicts how the contact depicted in FIG. 1A can be intentionally "broken" by the present invention to form the pseudo-transistor. Similarly, FIG. 3B shows how the gate structure depicted in FIG. 1B can be intentionally "broken" by the present invention to form the pseudo-transistor. FIG. 3C is a cross-sectional of both the gate region 12 and active regions 16, 18, the contact to the active region 18 being intentionally "broken" by the present invention to form the pseudo-transistor. One skilled in the art will appreciate that the although these figures depict enhancement mode devices, the pseudo-transistor may also be a depletion mode device. Where the gate, source or drain contacts are intentionally "broken" by the present invention. In the case of a depletion mode transistor, if the gate contact is "broken", the device will be "ON" when a nominal voltage is applied to the control electrode. If the source or drain contact is "broken", the pseudo-depletion mode transistor will essentially be "OFF" for a nominal voltage applied to the control electrode.

Figure 2:
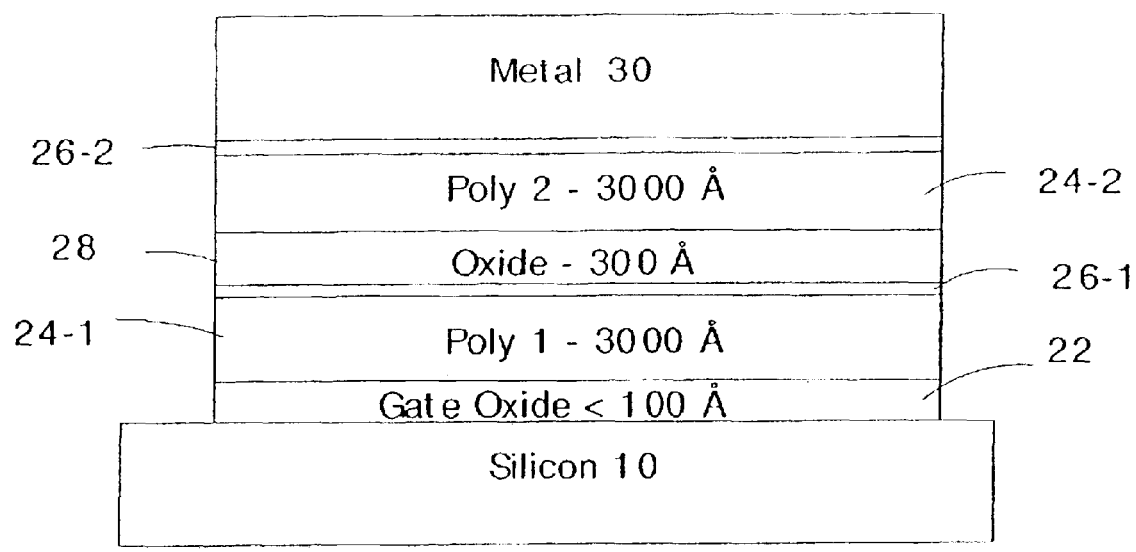
FIG. 2 is a cross-sectional view through a gate region with conventional double poly processing.

FIG. 2 shows typical process dimensions used in modern double poly semiconductor processing. The double-poly process preferably includes two layers of polysilicon 24-1, 24-2 and may also have two layers of salicide 26-1, 26-2. The thicknesses represented are preferable thicknesses. Double polysilicon processing may be used to arrive at the structures shown in FIGS. 3, 3A, 3B and 3C. One skilled in the art will appreciate that the structures shown in FIGS. 3, 3A, 3B and 3C are not limited to the thickness dimensions shown in FIG. 2.

FIG. 3 shows a pseudo-FET transistor in plan view, but those skilled in the art will appreciate that the metal contact of a bipolar transistor is very similar to the source/drain contact depicted. FIG. 3A is a side elevation view of the pseudo-transistor in connection with what appears to the reverse engineer (viewing from the top, see FIG. 3) as an active area metal layer 30, 31 of a CMOS FET. Alternatively, the device could be a vertical bipolar transistor in which case the metal layer 30, 31 that the reverse engineer sees could be an emitter contact. As depicted in FIG. 3A, for a CMOS structure, an active region 18 may be formed in a conventional manner using field oxide 20 as the region boundary. The active region 18 is implanted through gate oxide 22 (see FIG. 3C), which is later stripped away from over the active regions and optionally replaced with the silicide metal which is then sintered, producing a silicide layer 26-1. Next, a dielectric layer 28 is deposited. In the preferred embodiment, the dielectric layer is a silicon dioxide ($SiO_2$)

layer 28. Additionally, a polysilicon layer 24-2 may be deposited over the silicon dioxide layer 28. Polysilicon layer 24-2 is preferably the second polysilicon layer in a double polysilicon process. Optional silicide layer 26-2 is then formed over the polysilicon layer 24-2. A second silicon dioxide (SiO$_2$) layer 29 is deposited and etched to allow a metal layer, including metal plug 31 and metal contact 30 to be formed over the optional silicide layer 26-2 or in contact with polysilicon layer 24-2 (if no suicide layer 26-2 is utilized). The oxide layer 28 and oxide layer 29 are preferably comprised of the same material (possibly with different densities) and as such are indistinguishable from each other to the reverse engineer when placed on top of each other.

Different masks are used in the formation of the polysilicon layer 24-2 and the metal plug 31. In order to maintain alignment between the polysilicon layer 24-2 and the metal plug 31, a cross-section of the polysilicon layer 24-2 in a direction parallel to the major surface 11 of the semiconductor substrate 10 is preferably designed to be essentially the same size, within process alignment tolerances, as a cross-section of the metal plug 31 taken in the same direction. As such, the polysilicon layer 24-2 is at least partially hidden by the metal plug 31. In FIGS. 3, 3A, 3B and 3C, the polysilicon layer 24-2 is depicted as being much larger than metal plug 31; however, these figures are exaggerated simply for clarity. Preferably, the polysilicon layer 24-2 is designed to ensure that a cross-section of metal plug 31 is aligned with a cross-section of polysilicon layer 24-2, or a cross-section of optional silicide layer 26-2 if used, yet small enough to be very difficult to view under a microscope. Further, the bottom of metal plug 31 is preferably completely in contact with the polysilicon layer 24-2, or optional silicide layer 26-2 if used. One skilled in the art will appreciate process alignment tolerances vary by process. For example, for a 0.5 μm process, typical alignment tolerances are in the range from 0.1 μm to 0.15 μm.

The reverse engineer cannot easily obtain an elevation view such as those shown in FIGS. 2, 3A, 3B or 3C. In fact, the typical manner in which the reverse engineer would obtain the elevation views would be via individual cross-sectional scanning electron micrographs taken at each possible contact or non-contact. The procedure of taking micrographs at each possible contact or non-contact is prohibitively time consuming and expensive. The reverse engineer, when looking from the top, will see the top of the metal contact 30, see FIG. 3. The contact-defeating layer of oxide 28 with polysilicon layer 24-2 and optional suicide layer 26-2 will be at least partially hidden by a feature of the circuit structure, i.e. metal contact 30 and metal plug 31.

The reverse engineering process usually, involves delayering the semiconductor device to remove the layers down to the silicon substrate 10, and then viewing the semiconductor device from a direction normal to the major surface 11 of the silicon substrate 10. During this process, the reverse engineer will remove the traces of the oxide layer 28 which is used in the present invention to disable the contact.

Further, the reverse engineer may chose a more costly method of removing only the metal contact 30 from the semiconductor area. A cross-section of polysilicon layer 24-2 is preferably essentially the same size, within process alignment tolerances, as a cross-section of metal plug 31. The oxide layers 28, 29 are practically transparent, and the thicknesses of the optional silicide layer 26-2 and the polysilicon layer 24-2 are small. A typical thickness of the optional silicide layer 26-2 is 100–200 angstroms, and a typical thickness of the polysilicon layer 24-2 is 2500–3500 angstroms. Thus, the reverse engineer when viewing the device from the top will assume that the metal plug 31 is in contact with the silicide layer 26-1, thereby assuming incorrectly that the device is operable. Further, when the optional silicide layer 26-2 is used, the reverse engineer may be further confused when looking at the device once the metal plug 31 has been removed. Upon viewing the shiny reside left by the suicide layer 26-2, the reverse engineer will incorrectly assume that the shiny reside is left over by the metal plug 31. Thus, the reverse engineer will again incorrectly assume that the contact was operational.

FIG. 3B is a side elevation view of a gate contact of the psuedo-transistor of FIG. 3. As can be seen from FIG. 3, the view of FIG. 3B, which is taken along section line 3B—3B, is through a gate oxide layer 22, through a first polysilicon layer 24-1 and through a first a silicide layer 26-1 which are formed over the field oxide region 20 and gate region 12 in the semiconductor substrate 10 (typically silicon) between active regions 16 and 18 (see FIG. 3C). The first polysilicon layer 24-1 would act as a conductive layer which influences conduction through the gate region 12 by an application of control voltages, if this device functioned normally. Active regions 16, 18 and 12, gate oxide 22, the first polysilicon layer 24-1, and the first suicide layer 26-1 are formed using conventional processing techniques. For a normally functioning device, a control electrode formed by metal layer 30, 31 would be in contact with the layer of silicide layer 26-1 over field oxide 20. The silicide layer 26-1 would then act as a control layer for a normally functioning device. To form a pseudo-transistor, at least one dielectric layer, for example a layer of oxide 28, is deposited. Next, a second polysilicon layer 24-2 and an optional second silicide layer 26-2 are deposited over the oxide layer 28. The layer of silicide 26-2 depicted between the polysilicon layer 24-2 and metal plug 31 may be omitted in some fabrication processes, since some double-polysilicon processing techniques utilize only one layer of silicide (when such processing techniques are used only one layer of silicide 26-1 or 26-2 would be used). In either case, the normal functioning of the gate is inhibited by the layer of oxide 28.

A cross-section of the second polysilicon layer 24-2 in a direction parallel to the normal surface 11 of the semiconductor substrate 10 is preferably essentially the same size, within process alignment tolerances, as a cross-section of metal plug 31 taken in the same direction. As such, the second polysilicon layer 24-2 is partially hidden by metal plug 31. In FIGS. 3, 3A, 3B and 3C, the polysilicon layer 24-2 is depicted as being much larger than metal plug 31; however, these figures are exaggerated simply for clarity. Preferably, the polysilicon layer 24-2 is designed to ensure that the cross-section of metal plug 31 is completely aligned with the cross-section of polysilicon layer 24-2, or a cross-section of optional silicide layer 26-2 if used, yet small enough to be very difficult to view under a microscope. Further, the bottom of metal plug 31 is preferably completely in contact with the polysilicon layer 24-2, or the optional silicide layer 262 if used. One skilled in the art will appreciate process alignment tolerances vary by process. For example, for a 0.5 μm process, typical alignment tolerances are in the range from 0.1 μm to 0.15 μm.

The added oxide layer 28 and polysilicon layer 24-2 are placed such that they occur at the normal place for the metal to polysilicon contact to occur as seen from a plan view. The placement provides for the metal layer 30, 31 to at least partially hide the added oxide layer 28 and/or polysilicon layer 24-2, so that the layout appears normal to the reverse engineer. The reverse engineer will etch off the metal layer 30, 31 and see the polysilicon layer 24-2 and possible reside from optional silicide layer 26-2, if used. Upon seeing the shiny reside from optional silicide layer 26-2 the reverse engineer may incorrectly assume that the shiny reside is from the metal plug 31. A reverse engineer would not have any reason to believe that the contact was not being made to polysilicon layer 24-1 or optional silicide layer 26-1. Further, when optional suicide layer 26-2 is not used, the small thicknesses of oxide layer 28 and polysilicon layer 26-2 are not clearly seen when viewing the contact from a direction normal to the major surface 11 of the silicon substrate 10, and thus the reverse engineer will conclude he or she is seeing a normal, functional polysilicon gate FET transistor.

In use, the reverse engineering protection techniques of FIG. 3A, FIG. 3B and/or FIG. 3C need only be used sparingly, but are preferably used in combination with other reverse engineering techniques such as those discussed above under the subtitle "Related Art." The basic object of these related techniques and the techniques disclosed herein is to make it so time consuming to figure out how a circuit is implemented (so that it can be successfully replicated), that the reverse engineer is thwarted in his or her endeavors. Thus, for the many thousands of devices in a modern IC, only a small fraction of those will employ the pseudo-transistors described herein and depicted in FIGS. 3A, 3B and 3C to camouflage the circuit. Therefore, unless the reverse engineer is able to determine these pseudo-transistors, the resulting circuit determined by the reverse engineer will be incorrect.

Additionally, the pseudo-transistors are preferably used not to completely disable a multiple transistor circuit in which they are used, but rather to cause the circuit to function in an unexpected or non-intuitive manner. For example, what appears to be an OR gate to the reverse engineer might really function as an AND gate. Or what appears as an inverting input might really be non-inverting. The possibilities are almost endless and are almost sure to cause the reverse engineer so much grief that he or she gives up as opposed to pressing forward to discover how to reverse engineer the integrated circuit device on which these techniques are utilized.

Also, when the reverse engineer etches away the metal 30, 31, he or she should preferably "see" the normally expected layer whether or not a contact is blocked according to the present invention. Thus, if the reverse engineer expects to see suicide after etching away metal, that is what he or she should see even when the contact is blocked. If he or she expects to see polysilicon after etching away metal, that is what he or she should see even when the contact is blocked.

One skilled in the art will appreciate that other dielectric materials, such as silicon nitride $Si_3N_4$, may be used in the place of silicon dioxide. One skilled in the art will also appreciate that the silicide layers 26-1 and 26-2 are not required to be placed in the gate region. In modern semiconductor manufacturing processes, particularly where the feature size is less than 0.5 micrometers, a silicide layer is typically used to improve conductivity. However, the present invention is directed toward giving the appearance of a functioning transistor device to the reverse engineer where the contact is actually disabled. Since conductivity is not an issue, and in fact conductivity is prevented, silicide layers 26-1 and 26-2 are not required to be placed in the gate region when the contact is to be broken. However, silicide layers 26-1 and 26-2 may be placed over the gate region to simplify the number of masks required and thus the semiconductor manufacturing process and to further mislead the reverse engineer by the shiny residue which it leaves behind during some reverse engineering processes.

Having described the invention in connection with certain preferred embodiments thereof, modification will now certainly suggest itself to those skilled in the art. As such, the invention is not to be limited to the disclosed embodiments, except as is specifically required by the appended claims.

What is claimed is:

1. A camouflaged circuit structure, comprising:
   a semiconductor substrate;
   an implanted region in said substrate;
   a metal layer which is associated with said implanted region and which appears, in plan view, to be electrically coupled to said implanted region; and
   a dielectric layer disposed between said implanted region and said metal layer to thereby insulate said metal layer from said implanted region, the dielectric layer having dimensions such that when viewed in said plan view, said dielectric layer is at least partially hidden by a feature of the circuit structure,
the camouflaged circuit structure further including a polysilicon layer disposed between the dielectric layer and the metal layer.

2. The camouflaged circuit structure of claim 1 wherein the circuit feature which at least partially hides the dielectric layer is a metal plug associated with the metal layer.

3. The camouflaged circuit structure of claim 2 further including a suicide layer disposed over said implanted region, the metal layer being normally electrically coupled to said implanted region via said silicide layer and the metal plug associated with the metal layer, the dielectric layer blocking the electrical coupling.

4. The camouflaged circuit structure of claim 3 wherein the dielectric layer is disposed between the metal layer and said silicide layer.

5. The camouflaged circuit structure of claim 1 wherein the semiconductor substrate is comprised of silicon and wherein the dielectric layer is comprised of silicon dioxide.

6. The camouflaged circuit structure of claim 1 wherein the circuit structure appears to be a normally functioning field-effect transistor when viewed in plan view.

7. The camouflaged circuit structure of claim 1 wherein the circuit structure appears to be a normally functioning bipolar device when viewed in plan view.

8. A camouflaged circuit structure, comprising:
   a semiconductor substrate;
   an active region in said substrate;
   a conductive layer which is associated with said active region and which appears, in plan view, to be arranged to influence conduction through said active region by an application of control voltages thereto;
   a control electrode which is associated with said conductive layer and which appears, in plan view, to be electrically connected to said conductive layer; and
   at least one dielectric layer disposed between said conductive layer and said control electrode for intentionally keeping said conductive layer from influencing conduction through said active region in response to an application of control voltages to said control electrode,
the camouflaged circuit structure further comprising a layer of polysilicon disposed between the at least one dielectric layer and the control electrode, wherein the at least one dielectric layer includes an oxide layer.

9. The camouflaged circuit structure of claim 8 wherein the at least one dielectric layer has dimensions such that when viewed in plan view, said dielectric layer is at least partially hidden by a feature of the circuit structure.

10. The camouflaged circuit structure of claim 8 wherein said active region is a gate region and at least one dielectric layer programs said gate region to an 'off' conduction state.

11. A pseudo-transistor comprising:

an active region disposed in a substrate;

an insulating, non-electrically conductive layer disposed over at least a portion of said active region;

a polysilicon layer disposed over at least a portion of said insulating, non-electrically conductive layer disposed over at least a portion of said active region, the insulating, non-electrically conductive layer electrically isolating the polysilicon layer from the active region; and a metal layer in electrical communication with said polysilicon layer and electrically isolated from the active region, the insulating, non-electrically conductive layer, the polysilicon layer and the metal layer each having dimensions such that when viewed in a plan view, the metal layer appears to be in electrical communication with the active region.

12. The pseudo-transistor of claim 11 wherein said metal layer includes a metal plug, said metal plug having a cross-section and said polysilicon layer having a cross-section, said metal plug cross-section and said polysilicon layer cross-section being essentially the same size.

13. The pseudo-transistor of claim 11 further comprising a first silicide layer disposed over said active region.

14. The pseudo-transistor of claim 13 further comprising a second suicide layer disposed over said polysilicon layer.

15. The pseudo-transistor of claim 11 wherein said insulating, non-electrically conductive layer comprises silicon dioxide, $SiO_2$.

16. The pseudo-transistor of claim 11 wherein said insulating, non-electrically conductive layer comprises silicon nitride, $Si_3N_4$.

17. A non-operational semiconductor gate contact comprising:

a metal layer;

a first polysilicon layer;

a second polysilicon layer disposed at least between said metal layer and said first polysilicon layer; and an insulating, non-conductive layer disposed at least between said first polysilicon layer and said second polysilicon layer.

18. The non-operable semiconductor gate contact of claim 17 wherein said metal layer includes a metal plug, said metal plug having a cross-section and said second polysilicon layer having a cross-section, said metal plug cross-section and said second polysilicon layer cross-section being essentially the same size.

19. The non-operable semiconductor gate contact of claim 17 further comprising a first silicide layer disposed over at least a portion of said first polysilicon layer.

20. The non-operable semiconductor gate contact of claim 19 further comprising a second suicide layer disposed over said second polysilicon layer.

21. The non-operable semiconductor gate contact of claim 17 wherein said insulating, non-conductive layer comprises silicon dioxide, $SiO_2$.

22. The non-operable semiconductor gate contact of claim 17 wherein said insulating, non-conductive layer comprises silicon nitride, $Si_3N_4$.

* * * * *

UNITED STATES PATENT AND TRADEMARK OFFICE
CERTIFICATE OF CORRECTION

PATENT NO. : 6,897,535 B2
APPLICATION NO. : 10/438689
DATED : May 24, 2005
INVENTOR(S) : Lap-Wai Chow et al.

It is certified that error appears in the above-identified patent and that said Letters Patent is hereby corrected as shown below:

Title page,
Item [73], Assignee, change "HRL Laboratories, LLC, Mailbu, CA (US)" to --HRL Laboratories, LLC, Mailbu, CA (US); Raytheon Company, Lexington, MA (US)--

Signed and Sealed this

Fourth Day of September, 2007

JON W. DUDAS
*Director of the United States Patent and Trademark Office*